United States Patent [19]

Niehaus et al.

[11] Patent Number: 5,165,039
[45] Date of Patent: Nov. 17, 1992

[54] REGISTER FILE FOR BIT SLICE PROCESSOR WITH SIMULTANEOUS ACCESSING OF PLURAL MEMORY ARRAY CELLS

[75] Inventors: Jeffrey A. Niehaus, Dallas; Jesse O. Englade, Plano, both of Tex.

[73] Assignee: Texas Instruments Incorporated, Dallas, Tex.

[21] Appl. No.: 845,725

[22] Filed: Mar. 28, 1986

[51] Int. Cl.[5] .................................. G06F 12/00
[52] U.S. Cl. .................... 395/800; 364/923.71; 364/923.5; 364/239.51; 364/247; 395/425
[58] Field of Search ... 364/200 MS File, 900 MS File; 365/230, 189; 395/425, 800

[56] References Cited

U.S. PATENT DOCUMENTS

| | | | |
|---|---|---|---|
| 3,643,236 | 2/1972 | Kolankowsky | 365/189.04 |
| 4,032,895 | 6/1977 | Lanza et al. | 364/200 |
| 4,130,900 | 12/1978 | Watanabe | 365/189.04 |
| 4,150,441 | 4/1979 | Ando | 365/189 |
| 4,224,676 | 9/1980 | Appelt | 364/712 |
| 4,380,046 | 4/1983 | Fung | 364/200 |
| 4,393,468 | 7/1983 | New | 364/736 |
| 4,405,992 | 9/1983 | Blau et al. | 364/748 |
| 4,442,498 | 4/1984 | Rosen | 364/745 |
| 4,449,201 | 5/1984 | Clark | 364/900 |
| 4,467,444 | 8/1984 | Harmon, Jr. et al. | 364/900 |
| 4,468,748 | 8/1984 | Blau et al. | 364/748 |
| 4,476,523 | 10/1984 | Beauchamp | 364/200 |
| 4,488,264 | 12/1984 | Dshkunian | 365/189.04 |
| 4,502,115 | 2/1985 | Eguchi | 364/200 |
| 4,507,759 | 3/1985 | Yasui | 365/189 |
| 4,528,641 | 7/1985 | Burrows | 364/757 |
| 4,554,645 | 11/1985 | Furman | 365/189 |
| 4,561,072 | 12/1985 | Arakawa | 365/230.03 |
| 4,569,036 | 2/1986 | Fujii | 365/189 |
| 4,610,004 | 9/1986 | Moller et al. | 365/230 |
| 4,630,230 | 12/1986 | Sundet | 365/189.04 |
| 4,651,308 | 3/1987 | Sato | 365/230 |
| 4,656,610 | 4/1987 | Yoshida | 365/189 |
| 4,656,614 | 4/1987 | Suzuki | 365/189 |
| 4,660,181 | 4/1987 | Saito et al. | 365/189 |
| 4,663,741 | 5/1987 | Reinschmidt | 365/189 |
| 4,683,555 | 7/1987 | Pinkham | 365/189 |
| 4,697,248 | 9/1987 | Shirota | 364/754 |
| 4,701,889 | 10/1987 | Ando | 365/230 |
| 4,719,596 | 1/1988 | Bernstein | 365/189.04 |
| 4,719,602 | 1/1988 | Hag et al. | 365/230 |
| 4,729,119 | 3/1988 | Dennison et al. | 365/230 |
| 4,731,761 | 3/1988 | Kobayashi | 365/230 |
| 4,750,154 | 6/1988 | Lefsky | 365/189.04 |
| 4,752,913 | 6/1988 | Chan et al. | 365/230 |
| 4,773,049 | 9/1988 | Takemae | 365/230 |
| 4,789,960 | 12/1988 | Willis | 365/189 |
| 4,802,135 | 1/1989 | Shinoda | 365/230 |
| 4,811,269 | 3/1989 | Hirose | 364/754 |
| 4,897,816 | 1/1990 | Kogan | 365/189.12 |
| 4,910,700 | 3/1990 | Hartley | 364/754 |

OTHER PUBLICATIONS

"32-Bit Supermini Built with Bit-Slice IC Family", by Jeff Niehaus, Electronic Design, May 12, 1983.
"Chip Set Eases Bit-Slice Design While Tackling Video-Speed Processing", by Jeff Niehaus et al., Electronics, Oct. 20, 1983, pp. 133-138.
"Advanced Schottky 8-Bit-Slice Processor Components", Product Preview Pamphlet, Texas Instruments Incorporated, 1982.
"Digital System Design with LSI Bit-Slice Logic", by Glenford J. Myers, (Pub. J. Wiley and Sons, Inc.), 1980, pp. 48-57; 65-77; 79-82; 86-91; 100-105; 113-119; and 124-127.

Primary Examiner—Thomas Lee
Assistant Examiner—Eric Coleman
Attorney, Agent, or Firm—Troy J. Cole; B. Peter Barndt; Richard L. Donaldson

[57] ABSTRACT

A register file for a bit slice ALU includes a static RAM array (86) which is addressable by two input read addresses. The addresses decoded by decoders (104) and (106) for input to the array (86). The array (86) simultaneously outputs two data words in response to two read addresses to sense amps (94) and (98). Data can be written into the memory by storing it in a data latch (100) and addressing it with a separate write address. The separate write address is latched in a write address (108) which is enabled on the rising clock edge by control circuit (114).

17 Claims, 5 Drawing Sheets

REGISTER FILE FOR BIT SLICE PROCESSOR WITH SIMULTANEOUS ACCESSING OF PLURAL MEMORY ARRAY CELLS

TECHNICAL FIELD OF THE INVENTION

The present invention pertains in general to bit slice systems and, more particularly, to the register file in the processing section of the bit slice system.

BACKGROUND OF THE INVENTION

A bit slice system provides a designer with the tools to customize a processor to the needs of a given application. The bit slice architecture utilizes a bit slice processor which is comprised of a microsequencer and an expanded bit slice arithmetic logic unit (ALU). The microsequencer is combined with a microprogram memory and a microinstruction register to provide control codes for the bit slice ALU. This type of a processor is effectively a computer for disposal within a more sophisticated computer architecture. With the bit slice system, the designer can define the details of the system operation, including the instruction set to be implemented. This allows the designer to deviate from the preset instruction set which is common to most processors.

The bit slice ALU is a fundamental part of the system. This element is designed so that it can be connected to similar elements to provide an ALU of any desired word width. Central to the ALU slice is that its operation can be expanded to any number of bits by interconnection of like ALUs. For example, if an ALU with eight bits per circuit is utilized, four circuits would form the ALU for a thirty-two bit processor. The carry and shift lines provide communication between ALUs so that multiple bit arithmetic operations can be performed.

To provide localized storage for input and output operands, a register file is provided on the bit slice ALU. This register file allows the processing portion of the bit slice ALU to process a number of prestored operands and either output the resultant operand or store the result back in the register file. In order to increase speed, it is necessary to buffer data being extracted from the register file in order to both read data from the register file and write data back to it. Typically, this requires either an additional instruction cycle or separate latches and a multiplexed addressing scheme. Present systems provide only two address inputs to constitute a two operand machine which can be configured to a three operation machine with some multiplexers on the input address lines to allow writing back to a third location.

Register files on present systems have some disadvantages in that they are difficult to design around. This is due to the fact that these systems require external timing controls that must be accounted for in the initial timing design to ensure proper data flow. This significantly increases the design time when implementing a particular bit slice ALU into a bit slice processor. In view of these disadvantages, there exists a need for a bit slice ALU with a register file that is more versatile and tolerant with respect to timing constraints placed upon initial design of the system.

SUMMARY OF THE INVENTION

The present invention disclosed and claimed herein comprises a register file for a bit slice processor. The register file includes a plurality of memory cells arranged in rows and columns with each of the memory cells operable to store digital data. First and second decoders are provided for decoding first and second read addresses and accessing select rows of memory cells for outputting stored data therefrom. The rows selectable by the decoders can either be separate rows or a common row. The accessed data is output to two separate banks of sense amps for sensing an output therefrom. A write address is received and decoded and stored in a write address latch for activation of a select one of the rows of memory cells for receiving external data. The external data is received and stored in the select row of memory cells in response to decoding and latching of the write address. Control circuitry is provided for receiving a clock signal and latching the write address to the selected transition of the clock signal to store the data in the select row during this predetermined period of time.

In another embodiment of the present invention, the data to be stored is latched at the select transition of the clock signal for the predetermined period of time. The transition of the clock signal in the preferred embodiment is the leading edge with a predetermined duration of time being one half of the clock cycle.

BRIEF DESCRIPTION OF THE DRAWINGS

For a more complete understanding of the present invention and the advantages thereof, reference is now made to the following description taken in conjunction with the accompanying Drawings in which:

FIG. 11 is a flow diagram of the read and write operations.

DETAILED DESCRIPTION OF THE INVENTION

Bit Slice Processor Operation

Figure 1:
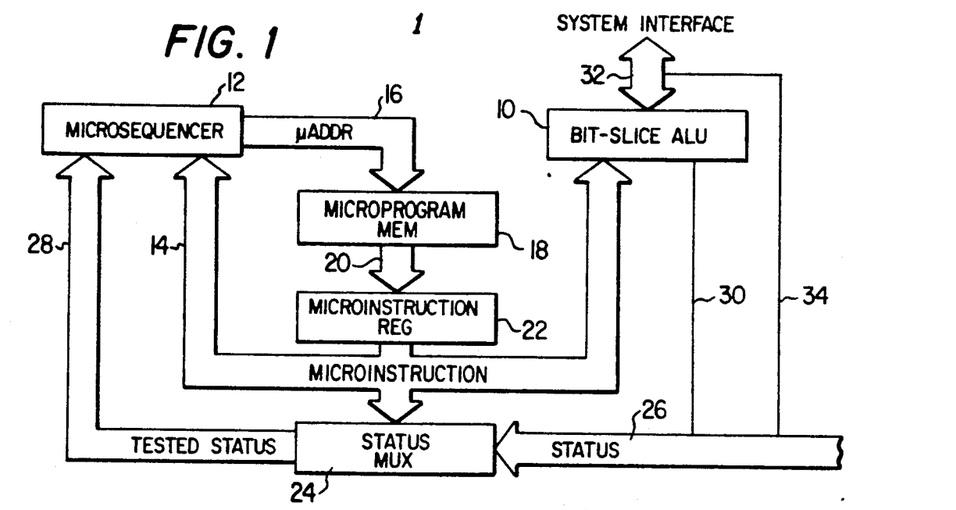
FIG. 1 illustrates a schematic block diagram of a bit slice processor.

With reference to FIG. 1, there is illustrated a schematic block diagram of a bit slice processor which is part of an overall bit slice system (not shown). The bit slice processor consists primarily of a bit slice ALU 10 and a microsequencer 12. These two elements operating in conjunction form a microprogrammed processor which operates in the background of a main memory processor program (not shown). The main program consists of the same type of macroinstructions that any processor executes. The microprogram is stored in the microsequencer 12 and is operable to control each element within the processor to determine the particular sequence of instructions that are carried out. The microprogram is primarily directed toward elemental details of each type of ALU operation, memory reference, and I/0 operation on a step-by-step basis.

To fetch and execute a single macroinstruction from main memory (the task of every processor), the bit slice processor must execute two or more sequences of microinstructions from the microprogram stored in the microsequencer 12. First, it executes a sequence of microinstructions to perform the instruction fetch and decode operations. Then, it executes the appropriate sequence of microinstructions that will implement the macroinstruction.

The microsequencer 12 and bit slice ALU 10 are interfaced with the microinstruction bus 14 which is a bidirectional bus. In addition, the microsequencer 12 outputs a microaddress on a microaddress bus 16 to a microprogram memory 18. The microprogram memory 18 has stored therein the microinstructions, which are output on a bus 20 to a microinstruction register 22 for storage therein. The microinstruction register 22 is interfaced on the output thereof with the microinstruction bus 14.

A status multiplexer 24 is provided for interfacing between the microinstruction bus 14 on one input and a status bus 26 on another input. The output of the status multiplexer 24 is a tested status bus 28 which is input to the microsequencer 12 to provide status information. The status bus 26 receives a status input from the ALU on lines 30. The bit slice ALU 10 interfaces with a system interface bus 32 which also interfaces with the status bus 26 through lines 34.

In operation, the bit slice ALU 10 is connected to the system interface bus 32 since this block performs all data and address manipulations. The status information of the bit slice ALU 10 is interfaced with the microsequencer 12 so that the microsequencer can implement any needed conditional branch or jump operations by the output of appropriate microinstructions. The control lines that define the operation of the bit slice ALU 10 must come from the microinstruction bus 14 since it defines what operation each element of the system is performing at each point in time.

The control code for the bit slice ALU 10 makes up part of the microinstruction code, or microcode for short. Another part of the microcode must define the memory and input/output operations, such as memory read, memory write, input Read and output Write, that are to occur. The number of bits that must be devoted to the ALU control code and the memory control code depends on the ALU bit slice function code length, and the number of memory input/output control signals that need to be generated. As described above, the microprogram memory 18 contains all of the microcode with the microinstruction register 22 holding the microcode for the microoperation that is currently being performed.

The microsequencer 12 determines which microinstruction is to be executed next, and must send this address to the microprogram memory 18. Normally, the next instruction is located immediately after the current instruction being executed, just as it is in the main computer program in main memory. Thus, the sequencer usually adds one to the present microaddress to get the next microaddress. In some cases, the microsequencer 12 must perform a branch or subroutine jump within the microprogram. The address for a jump to the next microinstruction to be executed must come from either the current microinstruction, or it must be an address generated as a result of the main instruction code or an interrupt condition. The branch address is generated by either a portion of the microcode and the microinstruction register 22, or it is generated by an internal interrupt vector circuit (not shown). The microsequencer 12 is therefore instructed as to whether to execute a branch, a subroutine jump, a subroutine return, or simply increment to the next microinstruction address in the microprogram memory 18.

Bit Slice ALU

Figure 2:
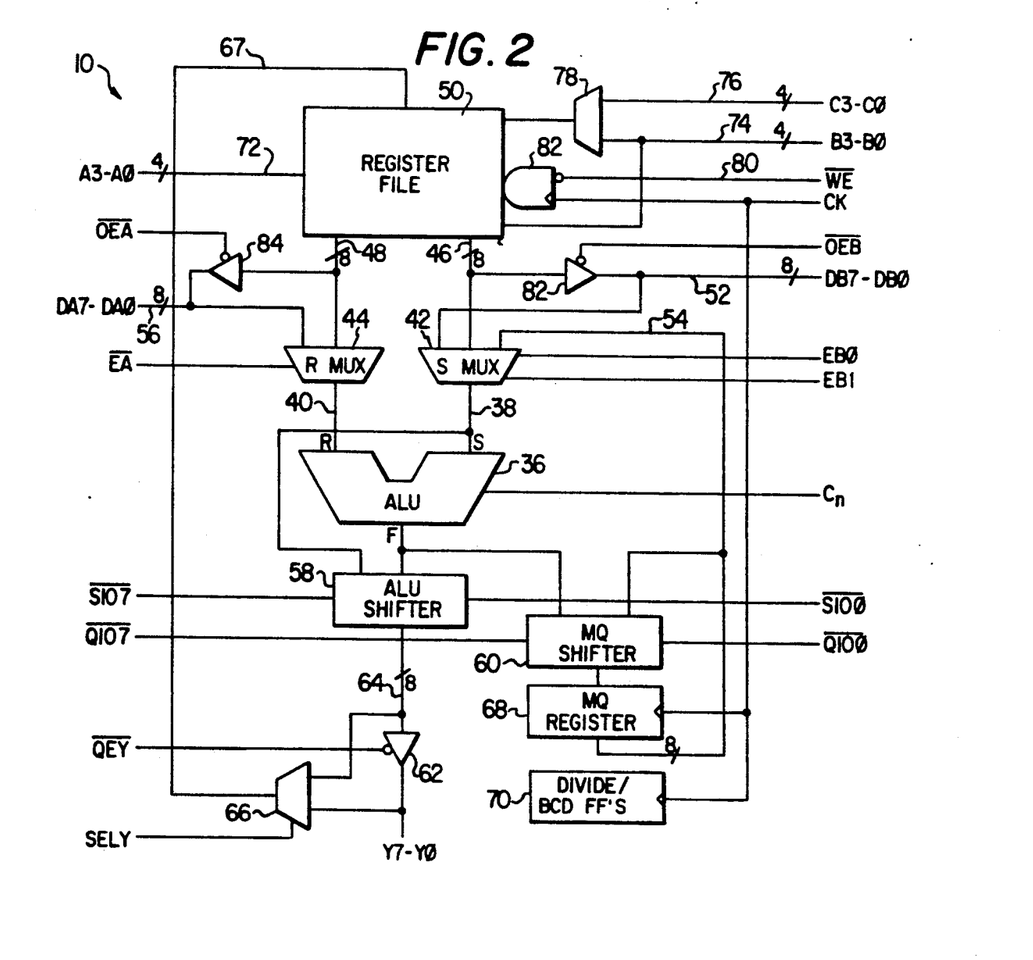
FIG. 2 illustrates a schematic block diagram of a bit slice ALU.

Referring now to FIG. 2, there is illustrated a schematic block diagram of the bit slice ALU 10. The bit slice ALU 10 includes an arithmetic logic unit (ALU) 36 which provides the processing capability of a conventional ALU. The ALU 36 has two inputs which are provided on an eight-bit wide S-bus 38 and an eight-bit wide R-bus 40. The S-bus 38 is connected to the output of a multiplexer 42 and the R-bus 40 is connected to the output of a multiplexer 44. Multiplexers 42 and 44 each have one input thereof connected to eight-bit buses 46 and 48, respectively, which are connected to two outputs from a register file 50. The multiplexer 42 has two remaining inputs, one of which is connected to an eight-bit bus 52 and the other of which is connected to an eight-bit bus 54. The multiplexer 44 has a second input which is connected to a data bus 56. Data buses 52 and 56 allow for input of two data words, each eight bits in length.

The output of the ALU 36 is connected to the input of an ALU shift circuit 58 and also to the input of a Multiply-Quotient shift circuit 60. The output of shift circuit 58 is connected to a Y-output through a gated buffer 62 through a bus 64. The bus 64 is also connected to one input of a multiplexer 66, the other input of which is connected to the output of buffer 62. The buffer 62 has the output thereof connected to the Y-output to provide an output for the bit slice ALU 10. The output of mutliplexer 66 is connected to the data input of the register file 50.

The shift circuit 60 has the output thereof connected to the input of a clocked register 68 through a bus 69, the output of which is connected to bus 54 for input to both the multiplexer 42 and also to the second input of the shifter 60. A divide flip-flop 70 is also provided for aiding in some of the processing operations of the bit slice ALU 10.

Register file

The register file 50 is operable to store sixteen eight-bit words and has the capability to output two digital words or operands therefrom which are addressed by an A-address that is input on an A-address bus 72 and a B-address that is input on a B-address bus 74. The register file 50 also has the capability of being written back into through a Write address which is input on a C-address bus 76. In addition, the Write address input can be multiplexed to receive the address from the B-address bus 74 through multiplexer 78. As will be described hereinbelow, the register file 50 has a data latch for interface with the feedback bus 67 and a Write address latch for interface with the Write address output by multiplexer 78. The Write address latch is controlled by a Write Enable signal on line 80 which is input to an AND circuit 82, the AND circuit 82 being clocked by a clock signal. The register file also has the capability to output data on data buses 52 and 56 through three state enable buffers 83 and 84, respectively.

In operation, the register file 50 can provide two operands to the ALU 36 or two operands can be eternally input on the data buses 52 and 56 to the ALU 36 The ALU output is then sent through a double precision shifter consisting of ALU shifter 58 and the MQ shifter 60. These shifters help perform bit shifts and multiplications and divisions. The output of the ALU shifter 58, which can be unshifted or shifted ALU data, can be stored back in the register file 50 through control of multiplexer 66 and/or output to the external Y bus. In double precision (16 bit) shifts and in multiplications, partial result components are stored in the MQ register.

Figure 3:
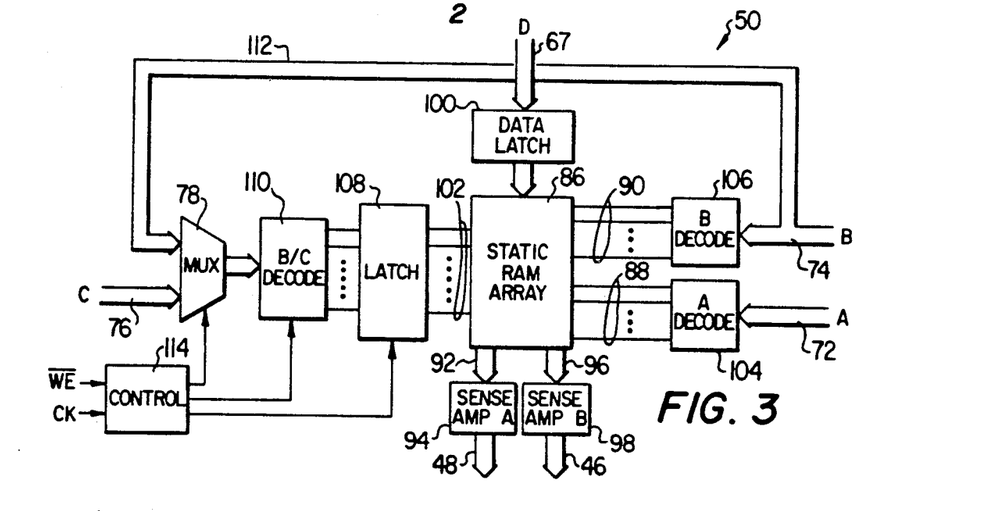
FIG. 3 illustrates a schematic block diagram of a register file for the bit slice ALU of FIG. 2.

Referring now to FIG. 3, there is illustrated a schematic block diagram of the register file 50, wherein like numerals refer to like parts in the various figures. Central to the register file 50 is a static Random Access Memory (RAM) array 86 which is comprised of sixteens rows and eight columns of static RAM cells (not shown). Each of the rows is selectable by a set of A-word lines 88 and B-word lines 90. One of the A-word lines 88 is selected in accordance with the A-address on bus 72 for output on a bus 92 to a bank of sense amps 94. One of the B-word lines 90 is selected in accordance with the B-address on bus 74 for output on a bus 96 to a bank of sense amps 98.

Data input on the bus 67 is input to a data latch 100, the output of which is input to the array 86 to a row of memory cells selected by word lines 102. Word lines 102 are operable to control writing of the information into the memory cells of the selected row whereas the memory cells selected by word lines 88 or 90 are operable to only read data from the selected memory cells.

The word lines 88 are connected to the output of a four-to-sixteen decoder 104, the input of which is connected to the bus 72 to receive a four bit address. In a similar manner, the word lines 90 are connected to the output of a four-to-sixteen decoder 106 which receives a four-bit input address from the bus 74. The word lines 102 for the write operation are connected to the output of a latch 108, the input of which is connected to the output of a four-to-sixteen decoder 110. The decoder 110 has the input thereof connected to the four-bit output of multiplexer 78 to receive either the four-bit C-address from bus 76 or the four-bit B-address through a connecting bus 112. The multiplexer 78, decoder 110 and latch 108 are controlled by a control circuit 114 which receives at the input thereof a Write Enable signal and a clock signal.

Figure 4:
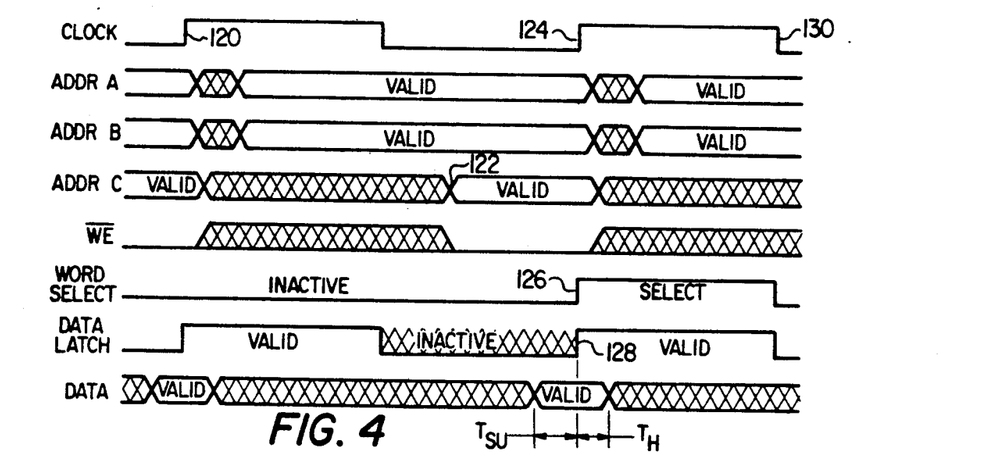
FIG. 4 illustrates a timing diagram for the bit slice ALU of FIG. 2.

Referring now to FIG. 4, there is illustrated a timing diagram for an access cycle for accessing the register file 50, extracting two operands therefor, processing the two operands and storing the result back in a predetermined location in the register file. Initially, an address is placed onto the A- and B-address buses to read the two operands. This occurs a predetermined time after the leading edge of the clock cycle, as represented by reference numeral 120. It should be understood that it is not important when the A- and B-addresses are placed on the address buses 72 and 74, respectively, since data is read out whenever the address becomes valid (i.e., a static operation).

The operands are output to sense amps 94 and 98 and then to the input of the ALU 36. The multiplexer 66 is operable to output the result, after a predetermined amount of processing time, onto bus 67 for input to the data latch 100. The write address is then placed on the C- address bus at transition 122 and the Write Enable signal goes low a predetermined amount of time before the next rising clock edge 124. At the clock edge 124, the write address is latched into latch 108 and a row is selected for writing data thereto, as indicated by the word select going high at transition 126. In addition, the data latch 100 is also activated at a transition 128. The row to which data is to be written from the data latch 100 is selected only until the trailing edge 130 of the clock signal, at which time the select signal goes inactive and the data valid signal also goes inactive. This ensures that data is not being written into the array at the next positive transition of the clock. If a different row were selected between two successive access cycles, this could cause an upset of data if there were a slight delay between this transition.

The reading of data and subsequent writing of data back into the memory is completed within one access cycle with three input addresses. Since this operation is triggered by the edge of the clock, it is only important to have valid data present a predetermined set up time $T_{SU}$ before the rising clock edge 124 and present for a predetermined hold time $T_H$ after the leading clock edge 124. Therefore, the designer need only ensure that the addresses are present at the predetermined time and that there is sufficient time for processing of the select data after accessing thereof.

Memory Array

Figure 5:
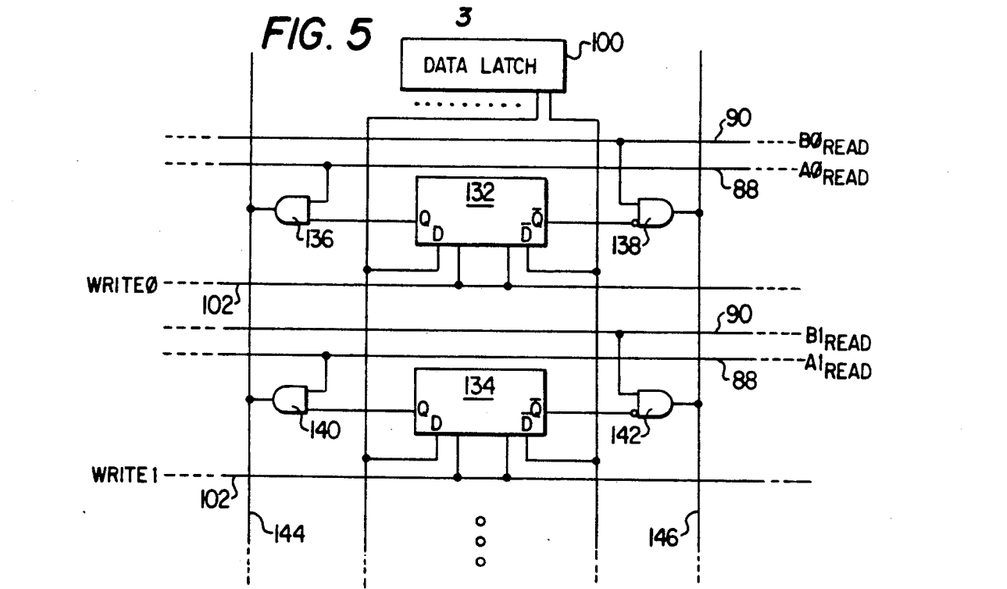
FIG. 5 illustrates a schematic block diagram of one column of the static RAM array in the register file of FIG. 3.

Referring now to FIG. 5, there is illustrated a schematic block diagram of one column of the array 86 illustrating two static RAM cells 132 and 134 in adjacent rows. The RAM cell 132 has a Q-output connected to one input of an AND gate 136, the other input of the AND gate 136 connected to an $A0_{READ}$ line 88 from the decode circuit 104. The inverted Q-output of the RAM cell 132 is connected to an inversion input on an AND gate 138, the other input of which is connected to the B0READ line 90 from the B-decoder 106. In a similar manner, the RAM cell 134 has the Q-output connected to one input of an AND gate 140, the other input of which is connected to the word line $A1_{READ}$ from the output of the A-decoder 104. The inverted Q-output of RAM cell 134 is connected to an inverting input of an AND gate 142, the other input of which is connected to the $B1_{READ}$ word line from the output of B-decoder 106. The AND gates 136 and 140 have the outputs thereof connected to an A-data line 144 and the output of AND gates 138 and 142 are connected to a B-data line 146, data lines 144 and 146 representing one bit of the addressed data with line 144 representing one bit in bus 92 and line 146 representing one bit in bus 96 for input to sense amps 94 and 98, respectively.

In the write mode, data is output from the data latch 100 on a D-line and an inverted D-line for input to each of the RAM cells 132 and 134. A WRITE0 input is connected to RAM cell 132 on one of the lines 102 and a WRITE1 signal is input to RAM cell 134 on one of the lines 102. In operation, activation of the A- or B- word lines will read data from the addressed row and activation of any of the write lines output from the latch 108 will cause data on the D-line and inverted D-line to be written into the addressed row of memory cells. This allows data to be written in and read out at the same time.

Figure 6A:
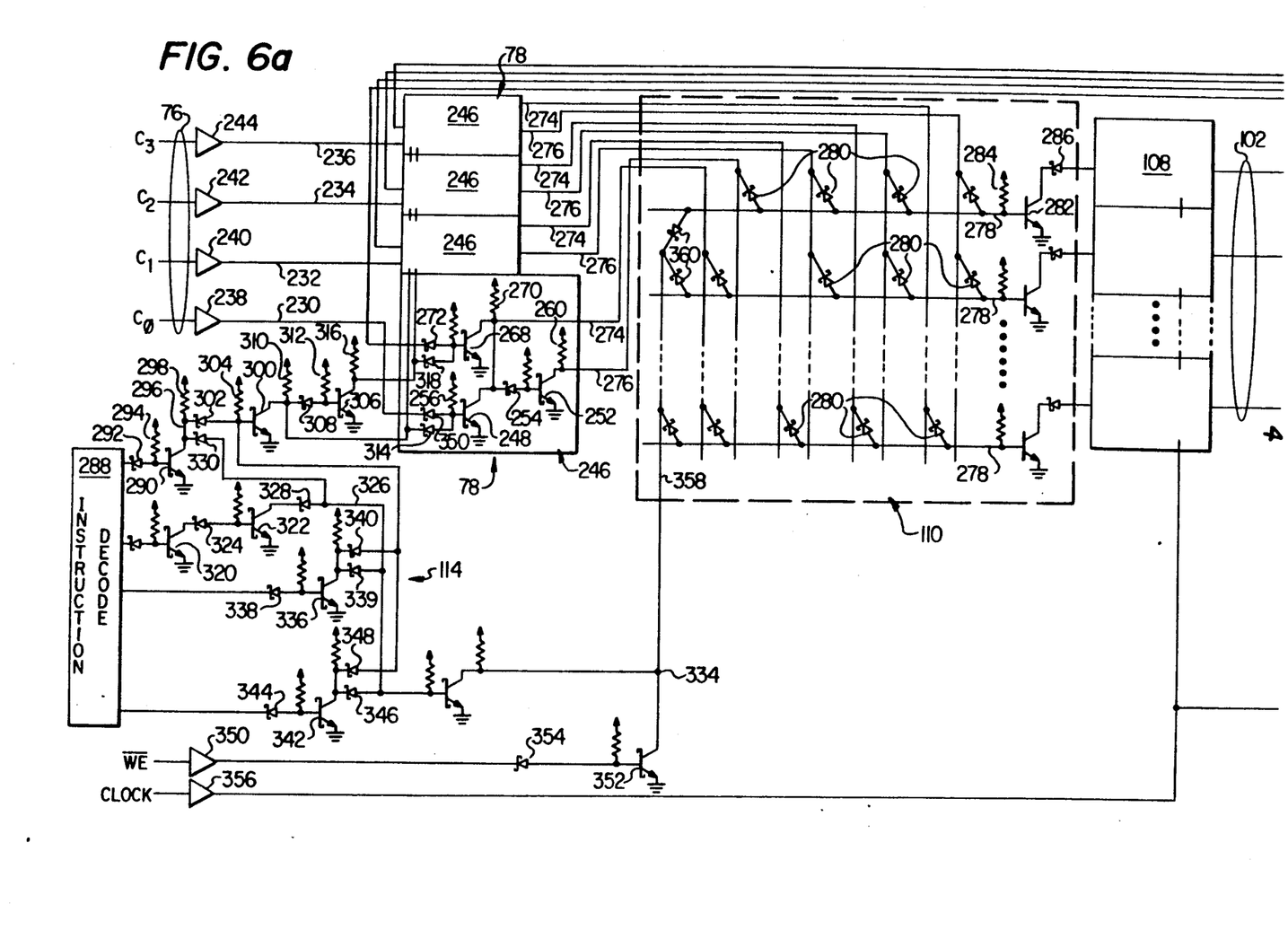
FIGS. 6a and 6b illustrate a partial schematic diagram of the register file of FIG. 3.
Figure 6B:
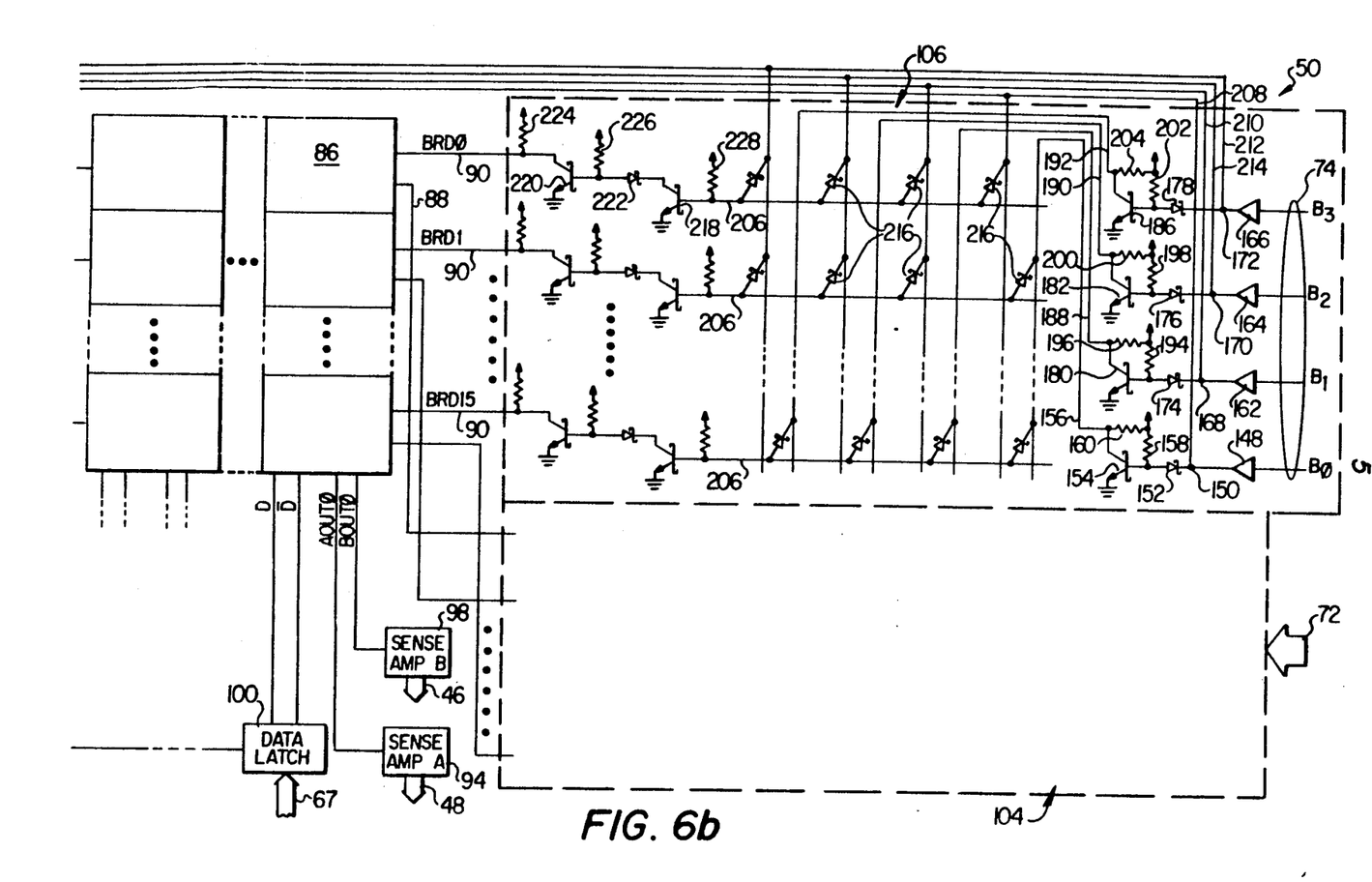

Referring now to FIGS. 6a and 6b, there is illustrated a more detailed schematic diagram of the register file 50, wherein like numerals refer to like parts in the various Figures. The B-decoder 106 receives a four-bit address from the bus 74 comprised of four address bits $B_0$–$B_3$. $B_0$ is input through a buffer 148 to a node 150. Node 150 is connected to the cathode of a diode 152, the anode of which is connected to the base of a transistor 154. Transistor 154 has the emitter thereof connected to ground and the collector thereof connected to a decode array line 156. A resistor 158 is connected between the base of transistor 154 and a positive supply. A resistor 160 is connected between the collector of transistor 154 and the positive supply. In a similar manner, the address lines $B_1$–$B_3$ are connected through buffers 162, 164 and 166 to nodes 168, 170 and 172, respectively. Node 168-172 are connected to the cathodes of diodes 174, 176 and 178, respectively. The anodes of diodes 174–178 are connected to the bases of transistors 180, 182, 184 and 186, respectively. Transistors 180-186 have the collectors thereof connected to array lines 188, 190 and 192, respectively. Transistor 180 has the base thereof connected to the positive supply through a resistor 194 and the collector thereof connected to the positive supply through a resistor 196. Transistor 182 has the base thereof connected to the positive supply through a resistor 198 and the collector thereof connected to the positive supply through a resistor 200. Transistor 186 has the base thereof connected to the positive supply through a resistor 202 and the collector thereof connected to the positive supply through a resistor 204.

The array 86 is comprised of eight columns and sixteen rows, of which only the first two rows and the last row are illustrated with only the first column of the array 86 illustrated. The decoder 106 outputs a separate word line 90 to each of the rows in the array 86 and is comprised internally of a matrix. The matrix is formed by the decode array lines 156, 188, 190 and 192 disposed orthogonally with respect to an array line 206. In addition, nodes 150, 168, 170 and 172 are connected to decode array lines 208, 210, 212 and 214, respectively, to provide the inverse of the array lines 156, 188, 190 and 192. Each of the orthogonal array lines 206 intersect each of the array lines 156, 188–192 and 202-214 with diodes 216 selectively disposed at the intersection with the anode thereof connected to the orthogonal array line 206 and the cathode thereof disposed on the intersecting array line. For the first of the orthogonal array lines 206, the diodes 216 are selectively disposed at the intersection of the orthogonal array line 206 with lines 208–214. This results in that array line being pulled low whenever any of the address lines B0-B3 are low. The coding for the orthogonal array line 206 for the second word line 90 is provided with diodes 216 being disposed at the intersection of the orthogonal array line 206 with decode array lines 210–214 and also with the decode array line 156. Therefore, whenever address lines $B_1$, $B_2$ or $B_3$ are low or $B_0$ is high, array line 206 is low.

Each of the array lines 206 is connected to the base of a transistor 218, the emitter of which is connected to ground and the collector of which is connected to the base of a transistor 220 through a diode 222. Transistor 220 has the emitter thereof connected to ground and the collector thereof connected to the word line 90. The collector of transistor 220 is connected to the positive supply through a resistor 224 with the base thereof connected to the positive supply through a resistor 226. Transistor 218 has the base thereof connected to the positive supply through a resistor 228. The A-decoder 104 is configured similar to the B-decoder 106.

The write decoder 110 receives four input lines $C_0$–$C_3$ from the bus 76 for input to nodes 230, 232, 234 and 236 through buffers 238, 240, 242 and 244, respectively. Each of the nodes 230-236 are input to enable circuits 246 in addition to the array decode lines 208-214 from the B-decoder 106, the enable circuits 246 forming the multiplexer 78. Each of the enable circuits 246 have the associated ones of nodes 230-236 connected to the base of a transistor 248 through a diode 250 with the anode of the diode 250 connected to the base of transistor 248. The emitter of transistor 248 is connected to ground and the collector thereof connected to the base of a transistor 252 through a diode 254, the anode of diode 254 connected to the base of transistor 252. The base of transistor 248 is connected to the positive supply through a resistor 256 and the base of transistor 252 is connected to the positive supply through a resistor 258. The collector of transistor 252 is connected to the positive supply through a resistor 260. The collector of transistor 248 is connected to the collector of a transistor 262, the emitter of which is connected to ground and the collector of which is connected to the positive supply through a resistor 270. The base of a transistor 268 is connected through a diode to an associated one of the array decode lines 208-214 from the decoder 106 through a diode 272, the diode 272 having the anode thereof connected to the base of transistor 252. When either of the associated nodes 230-236 from the write decoder 110 or the array decode lines 208-214 from the B-decoder 106 are low, the base of the associated transistor 248 or 268 is pulled low, thus turning off the associated transistor. This results in the collectors thereof going high and, in the case of transistor 248, allowing the collector of the transistor 252 to go low.

Each of the enable circuits 246 have two outputs, an inverted and a non-inverted output which is represented by an inverted line 274 and noninverted line 276. Each of these lines comprises one line of an array that is orthogonally disposed wit respect to an array line 278, each array 278 associated with one write address line in the array 86. Diodes 280 are selectively disposed at the intersection of the lines 274 and 276 and the lines 278 to determine the decoding. For example, in the first Write address line, the diodes 280 have the cathodes thereof connected to each of the lines 274 associated with the address input $C_0$–$C_3$. For the second Write address line 278, the diodes have the cathodes thereof connected to the array decode lines 274 associated with the address inputs $C_1$–$C_3$ and with the line 276 associated with the address input $C_0$. Each of the array lines 278 is connected to the base of a transistor 282 and also to the positive supply through a resistor 284. Transistor 282 has the emitter thereof connected to ground and the collector thereof connected to the input of an associated Write address latch in the latch 108 through a diode 286, the cathode of diode 286 connected to the collector of transistor 282. The output of the Write address latch 108 comprises the Write address inputs which are connected to each of the rows of memory cells in array 86.

In the control circuit 114, an instruction decode is received from an instruction decode circuit 288 to provide various instruction decode output signals. One instruction decode signal provides the enable signals for the multiplexer 78, the signal being input to a transistor 290 through a diode 292. The base of transistor 290 is also connected to the positive supply through a pull up resistor 294. The emitter of transistor 290 is connected to ground and the collector thereof is connected to a node 296, the node 296 being connected to the positive supply through a pull up resistor 298. Node 296 is connected to the base of a transistor 300 through a diode 302, the base of the transistor also connected to the positive supply through a pull up resistor 304. The emitter of transistor 300 is connected to ground and the collector thereof connected to the base of a transistor 306 through a diode 308 and also to the positive supply through a pull up resistor 310. The base of transistor 306 is also connected to the positive supply through a pull up resistor 312. The collector of transistor 300 is connected to the base of transistor 248 in each of the enable circuits 246 through a diode 314. The collector of transistor 306 is connected to the positive supply through a resistor 316 and the emitter thereof connected to ground. The collector of transistor 306 is connected to the base of the transistors 268 and each of the enable circuits 246 through a diode 318. The collector of transistor 300 when high controls the multiplex 78 to receive the C-address and, the collector of transistor 306, when high, enables the multiplexer 78 to receive the B-address from lines 208–214.

Another instruction signal from the instruction decoder 288 is input to the base of a transistor 320, the emitter of which is connected to ground and the collector of which is connected to the base of a transistor 322 through a diode 324. Transistor 322 has the emitter thereof connected to ground and the collector thereof connected to a node 326 through a diode 328. Node 326 is connected through a diode 330 to node 296 and also to the base of a transistor 332. The transistor 332 has the emitter thereof connected to ground and the collector thereof connected to an enable node 334. A third instruction signal from the instruction decode circuit 288 is connected to the base of a transistor 336 through a diode 338, the collector of transistor 336 being connected to node 326 through a diode 339 and also to the base of transistor 300 through a diode 340. A fourth instruction signal is connected to the base of a transistor 342 through a diode 344, the collector of which is connected to the node 326 through a diode 346 and to the base of transistor 300 through diodes 348.

The Write Enable signal is connected through a buffer 350 to the input of a transistor 352 through a diode 354. The emitter of transistor 352 is connected to ground and the collector thereof connected to node 334. The other control signal input to the device is the clock signal which is input through an inverter 356 to both the write address latch 108 and the data latch 100.

The node 334 is connected to a line 358 which intersects the array decode lines 278 in the Write address decoder 110 with a diode 360 connected between each of the array decode lines 78 and the intersecting line 358 with the anode thereof connected to the array decode lines 278 and the cathode thereof connected to the intersecting line 358. When node 334 goes low, the bases of all the transistors 282 are low, turning off transistors 282. This effectively disables the Write address latch 108.

Figure 7:
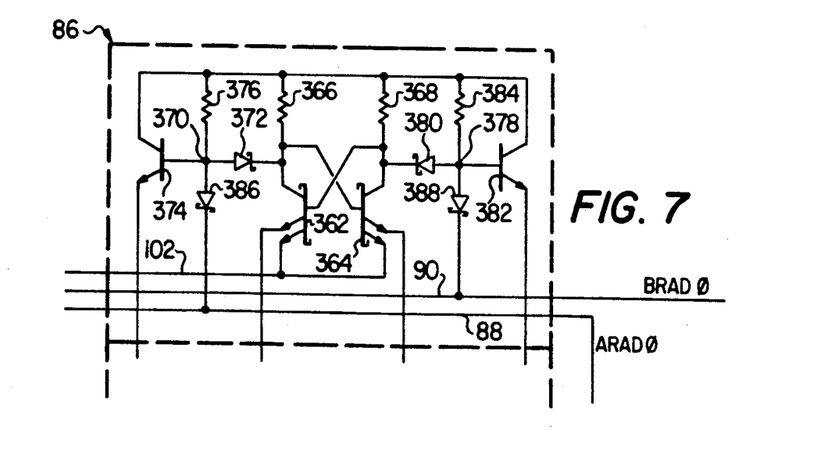
FIG. 7 illustrates a schematic diagram of one static RAM cell.

Referring now to FIG. 7, there is illustrated a schematic diagram of the RAM cell. The RAM cell consists of a pair of cross coupled transistors 362 and 364 with the base of transistor 362 connected to the collector of transistor 364 and the base of transistor 364 connected to the collector of transistor 362. Transistor 362 has two emitters, one emitter connected to the D-data line and transistor 364 and the other emitter connected to the write address line 102. Transistor 364 has two emitters, one emitter connected to the inverted data line and the other emitter thereof connected to the Write address line 102. The collector of transistor 362 is connected to the positive supply through a resistor 366 and the collector of transistor 364 is connected to the positive supply through resistor 368.

The collector of transistor 362 is connected to a node 370 through a diode 372, the cathode of diode 372 connected to the collector of transistor 362. Node 370 is connected to the base of a transistor 374 and also to the positive supply through a resistor 376. Transistor 374 has the collector thereof connected to the positive supply and the emitter thereof connected to the A-sense amp 94. The collector of transistor 364 is connected to a node 378 through a diode 380, diode 380 having the cathode thereof connected to the collector of transistor 364. Node 378 is connected to the base of a transistor 382 and also to the positive supply through a resistor 384. Transistor 382 has the collector thereof connected to the positive supply and the emitter thereof connected to the B-sense amp 98.

Node 370 is connected to the A-word line 88 through a diode 386, the cathode of diode 386 connected to word line 88. Node 378 is connected through a diode 388 to the B-word line 90, diode 388 having the cathode thereof connected to word line 90. Diodes 386 and 388 provide the AND function for the read operation.

Figure 8:
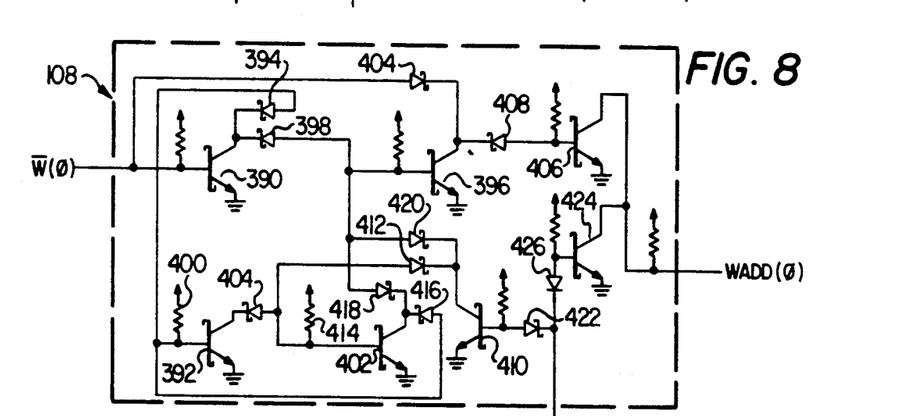
FIG. 8 illustrates a schematic diagram of the write address latch for one row.

Referring to FIG. 8, there is illustrated a schematic diagram of the Write address latch 108 for one row. Each row select signal on the output of the Write address decoder 110 is connected to the base of a transistor 390, the emitter of which is connected to ground and the collector of which is connected to the base of a transistor 392 through a diode 394. The collector of transistor 390 is also connected to the base of the transistor 396 through a diode 398. Transistor 392 has the emitter thereof connected to ground, the base thereof connected to the positive supply through a resistor 400 and the collector thereof connected to the base of a transistor 402 through a diode 404. Transistor 396 has the emitter thereof connected to ground and the base of transistor 390 through a diode 405 and also to the base of a transistor 406 through a diode 408. Transistor 402 has the base thereof connected to the collector of a transistor 410 through a diode 412 and also to the positive supply through a resistor 414.

The collector of transistor 402 is connected to the base of transistor 392 through a diode 416 and also to the base of transistor 396 through a diode 418. Transistor 410 has the emitter thereof connected to ground and the collector thereof connected to the base of transistor 396 through a diode 420 and the base thereof connected to the clock line through a diode 422. The clock line is also connected to the base of a transistor 424 through a diode 426, the collector of transistor 424 connected to the Write address line. Transistor 406 also has the collector thereof connected to the Write address line and the emitter thereof connected to ground.

Figure 9:
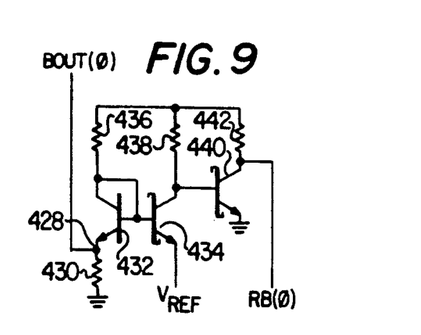
FIG. 9 illustrates a schematic diagram for one of the sense amps.

Referring now to FIG. 9, there is illustrated a schematic diagram of one of the sense amps 94 or 98. The bit line output from the memory cell is input to a node 428, node 428 being connected to ground through a resistor 430. A transistor 432 has the emitter thereof connected to node 428 and the base thereof connected to the collector thereof. The base of transistor 432 is also connected to the base of a transistor 434, the emitter of which is connected to a voltage reference $V_{REF}$. The collector of transistor 432 is connected to a positive supply voltage through a resistor 436 and the collector of transistor 434 is connected to the positive supply through a resistor 438. The collector of transistor 434 is connected to the base of a transistor 440, the emitter of which is connected to ground and the collector of which is connected to the positive supply through a resistor 442. The collector of transistor 442 comprises the output read line. The sense amp of FIG. 9 is operable to sense current and is thus in static operation.

Figure 10:
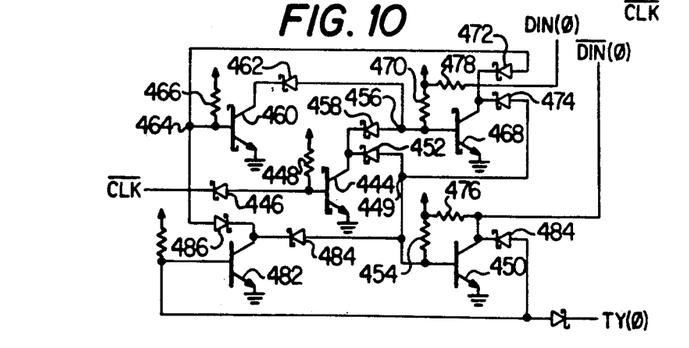
FIG. 10 illustrates a schematic diagram of one bit of the data latch.

Referring now to FIG. 10, there is illustrated a schematic diagram of one bit of the data latch. The clock signal is input to the base of a transistor 444 through a diode 446, the base of transistor 444 also connected to the positive supply through a resistor 448. Transistor 444 has the emitter thereof connected to ground and the collector thereof connected to a node 449 through a diode 452. Node 449 is connected to the base of a transistor 450, the base of the transistor 450 being connected to the positive supply through a resistor 454. The collector of transistor 452 is also connected to a node 456 through a diode 458.

Node 456 is connected to the collector of a transistor 460 through a diode 462. Transistor 460 has the emitter thereof connected to ground, the base thereof connected to a node 464 and also to the positive supply through a resistor 466. Node 456 is also connected to the base of a transistor 468, the emitter of which is connected to ground, the base thereof connected to the positive supply through a resistor 470 and the collector thereof connected to node 464 through a diode 472. The collector of transistor 468 is also connected to the base of transistor 450 through a diode 474. Transistor 450 has the collector thereof connected to the inverted data line and transistor 468 has the collector thereof connected to the D-line with the inverted data line connected to the positive supply through a resistor 476 and the D-line connected to the positive supply through a resistor 478. The collector of transistor 450 is also connected to the base of a transistor 482 through a diode 484. Transistor 482 has the emitter thereof connected to ground and the collector thereof connected to the base of transistor 450 through a diode 485 and also to node 464 through a diode 486.

In operation, the clock signal pulls the base of transistor 444 low at the rising edge to turn off transistor 444 which allows node 456 and node 449 to float with respect to transistor 444. The state of node 456 and 449 depends upon state of transistors 482 and 460. If the D-line or the inverted data line is low, this forces the associated transistor 460 or 482, respectively, to turn off, thus resulting in the associated transistor 468 or 450, respectively, to turn on. When transistors 468 or 450 turns on, the opposite one of the transistors is high which causes the base of the associated transistor to go low since transistor 460 or transistor 482 is turned on. When the clock edge falls, transistor 444 is again turned on, storing or latching the data. It can be seen that the data is only latched on the first half cycle and remains in the latch until the next rising edge. This was described above with reference to the timing diagram of FIG. 4.

Referring to FIG. 11, the above described read and write operations are shown in a flow chart. The read operation shows plural input requests A, B that are received, decoded, accessed and output. The write operation may asynchronously receive data and address information. On a rising clock pulse, the data and address information are latched and loaded into the RAM 86. When the clock makes its next transition, the data and address latches 100, 108 are released for receiving further data and address information.

In summary, there has been provided a register file for a bit slice ALU for use in a bit slice processor. The register file includes a static RAM array which is addressable by two read addresses for output to two separate banks of sense amps. This allows two operands to be simultaneously addressed. A Write address is also available simultaneous with the two read addresses to allow writing to the array. The address is latched and is controlled by the leading edge of the clock to enable writing of data therein. The data is stored in a data latch and is enabled on the rising clock edge. This allows data to be written to the RAM array during the first half of the cycle but read during the entire cycle. Therefore, two operands can be read from the memory, processed and written back to the register file during one access cycle with no requirement to multiplex addresses.

Although the preferred embodiment has been described in detail, it should be understood that various changes, substitutions and alterations can be made therein without departing from the spirit and scope of the invention as defined by the appended claims.

What is claimed is:

1. A register file for a bit slice processor, comprising:
 a plurality of memory cells arranged in rows and columns, each of said memory cells for storing or outputting information;
 a plurality of read access means, each for accessing a row of said memory cells in accordance with an associated one of a plurality of external read addresses for output of stored information therein, each of said read access means for simultaneously accessing a common row of said memory cells or for accessing separate rows of said memory cells;
 output means coupled to said memory cells for outputting said information accessed by said read access means;
 data means for receiving new information to be stored in said memory cells;
 receiving means for receiving and decoding an external write address to provide a row select signal corresponding to one of the rows of said memory cells;
 write latch means for receiving and temporarily storing said row select signal and applying it to the select one of said rows corresponding to said row select signal, application of said row select signal causing said new information received by said data means to be stored in said select row; and
 control means for receiving a clock signal and controlling said write latch means at a select one of the transitions of said clock signal to apply said row select signal for a predetermined duration of time for storage of the information in the ones of said memory cells in said select row.

2. The register file of claim 1 wherein said receiving means comprises write latch means for receiving said new information for temporary storage thereof and output of said new information to said memory cells, said write latch means controlled by said control means to store said new information during said predetermined period of time such that new information need only be present at the select one of the transitions of said clock signal for storage in said write latch means.

3. The register file of claim 1 wherein each of said memory cells comprises a static memory cell.

4. The register file of claim 1 wherein said output means comprises a plurality of sense amplifiers, one of said sense amplifiers coupled to each column.

5. The register file of claim 1 wherein said read access means comprises:
   first and second decoders for receiving first and second ones of said external read addresses for decoding thereof and output of first and second row select signals;
   said first and second row select signals for selecting any one of the rows of said memory cells for output of the information stored therein to said output means; and
   said output means comprising first and second sense means, respectively, each of said first and second sense means for receiving information from the row of said memory cells selected by said first and second row select signals, respectively.

6. The register file of claim 1 wherein each of said memory cells comprises a static random access memory cell and said output means comprises:
   an AND logic circuit having a first input connected to the information stored in said memory cell and a second input connected to the associated one of said read access means such that selection of said memory cell results in the output of said information from said AND logic circuit to a bit line, one of said bit lines associated with each column of said memory cells; and
   a sense amplifier coupled to said bit lines for sensing the logic level of the information output by said AND logic circuit.

7. The register file of claim 1 wherein said control means is further responsive to the presence of an external write enable signal having first and second states, said write enable signal in the first state inhibiting said write latch means from applying said row select signal for said predetermined period of time and in said second state, for allowing said write latch means to apply said row select signal for said predetermined period of time.

8. The register file of claim 1 wherein said external read addresses and said external write address are simultaneously received.

9. The register file of claim 1 wherein said select one of the transitions of said clock signal comprises the rising edge of said clock signal.

10. The register file of claim 9 wherein said predetermined period of time comprises one half cycle of said clock signal.

11. A bit slice processing unit, comprising:
    an array of memory cells arranged in rows and columns, each of said memory cells for storing or outputting stored digital data therefrom;
    first and second read accessing means, each of said first and second read access means for accessing a row of said memory cells from said array in accordance with first and second external read addresses, respectively, for output of the stored digital data therein, each of said first and second read access means for simultaneously accessing a common row of said memory cells or to simultaneously access separate rows of said memory cells;
    first and second output means for outputting from memory cells information respectively accessed by said first and second read access means;
    processing means having first and second inputs connected to said first and second output means for processing data on said first and second inputs in accordance with a predetermined logic function for output of a result therefrom to an external input/output terminal;
    data latch means for receiving and temporarily storing new digital data to be stored in said memory cells of said array;
    receiving means for receiving and decoding an external write address to provide a write row select signal corresponding to one of the rows of said memory cells;
    write latch means for receiving and temporarily storing said write row select signal and applying it to the select one of said rows in said array corresponding to said write row select signal, application of said write row select signal causing data stored in said data latch means to be stored in said select row;
    control means for receiving a clock signal and controlling said write latch means and said data latch means at a select one of the transitions of said clock signal to apply said row select signal for a predetermined period of time; and
    multiplex means for interfacing the input of said data latch means to either said external input/output terminal or the output of said processing means to either receive said new digital data from said processing means or said external input/output terminal.

12. The bit slice processing unit of claim 11 wherein said select ones of the transitions of said clock signal comprises the leading edge of said clock signal.

13. The bit slice processing unit of claim 12 wherein said predetermined duration of time comprises one half cycle of said clock signal.

14. A method for storing and transferring data in a bit slice processing unit, comprising:
    disposing a plurality of memory cells in an array and arranged in rows and columns, each of the memory cells for storing or outputting information;
    receiving and decoding first and second external read addresses for generation of first and second read row select signals, respectively;
    accessing the rows of memory cells corresponding to the first and second read row select signals for output of information stored therein such that two separate rows of memory cells are accessed or one common row is accessed by both the first and second read row select signals;
    outputting to a first output the information accessed in generation of the first read row select signal and outputting to a second output the accessed information corresponding to the second read row select signal;
    receiving new information to be stored in the memory cell and temporarily storing the new information;
    receiving and decoding an external write address to provide a write row select signal corresponding to one of the rows of the memory cells;
    temporarily storing the write row select signal and applying it to the select one of the rows corresponding to the write row select signal, application of the write row select signal causing the temporarily stored new information to be stored in the select row; and receiving a clock signal and controlling the temporarily storage of the new information and the latching of the write row select signal to occur at a select one of the transitions of the clock signal to apply the write row select signal to the memory cells for a predetermined period of time and to temporary store the information for the predetermined period of time.

15. The method of claim 14 wherein the select one of the transitions of the clock signal comprises the leading edge of the clock signal.

16. A register file for a bit slice processor, comprising:

a plurality of memory cells arranged in rows and columns, each of said memory cells for storing or outputting information;

a plurality of read access means each for accessing a row of said memory cells in accordance with an external read address for output of stored information therein, including;

first and second decoders for receiving first and second ones of said external read addresses for decoding thereof and output of first and second row select signals;

said first and second row select signals for selecting any one of the rows of said memory cells for output of the information stored therein;

output means comprising first and second sense means, each sense means for respectively receiving information from the row of said memory cells selected by said first and second row select signals, and for outputting information accessed by said decoders and row select signals;

data means for receiving new information to be stored in said memory cells;

receiving means for receiving and decoding an external write address to provide a row select signal corresponding to one of the rows in said memory ells;

a write latch for receiving and temporarily storing said row select signal and applying it to the select one of said rows corresponding to said row select signal application of said row select signal causing said new information received by said data means to be stored in said select row;

control means for receiving a clock signal and controlling said write latch at a select one of the transitions of said clock signal to apply said row select signal for a predetermined duration of time for transferring information from the data means to the memory cells in said select row.

17. A register file for a bit slice processor, comprising:

a static random access memory comprising a plurality of memory cells arranged in rows and columns, for storing or outputting information;

a plurality of read access means, each for accessing a row of said memory cells in accordance with an external read address for output of stored information therein, each of said read access means for simultaneously accessing a common row of said memory cells in accordance with an associated one of a plurality of external read addresses for output of stored information therein, each of said read access means for simultaneously accessing a common row of said memory cells or for accessing separate rows of said memory cells;

output means coupled to said static random access memory for outputting information accessed by said read access means and including an AND logic circuit having a first input connected to the information stored in a selected memory cell and a second input connected to one of said read access means such that selection of said memory cell results in the output of said information from said AND logic circuit to a bit line, one of said bit lines associated with each column of said memory cells;

a sense amplifier coupled to said bit lines for sensing the logic level of the information output by said AND logic circuit;

data means for receiving new information to be stored in said memory cells;

receiving means for receiving and decoding an external write address to provide a row select signal corresponding to one of the rows in said memory cells;

a write latch for receiving and temporarily storing said row select signal and applying it to the select one of said rows corresponding to said row select signal application of said row select signal causing said new information received by said data means to be stored in said select row;

control means for receiving a clock signal and controlling said write latch at a select one of the transitions of said clock signal to apply said row select signal for a predetermined duration of time for transferring information from the data means to the memory cells in said select row.

* * * * *